United States Patent
Anzou et al.

(10) Patent No.: US 8,037,376 B2
(45) Date of Patent: Oct. 11, 2011

(54) ON-CHIP FAILURE ANALYSIS CIRCUIT AND ON-CHIP FAILURE ANALYSIS METHOD

(75) Inventors: Kenichi Anzou, Kawasaki (JP); Chikako Tokunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 12/345,298

(22) Filed: Dec. 29, 2008

(65) Prior Publication Data
US 2009/0172483 A1    Jul. 2, 2009

(30) Foreign Application Priority Data
Dec. 28, 2007   (JP) ................................ 2007-339885

(51) Int. Cl.
*G11C 29/00* (2006.01)
(52) U.S. Cl. ...................................... 714/711; 714/723
(58) Field of Classification Search .................. 714/710, 714/711, 723, 733
See application file for complete search history.

(56) References Cited

U.S. PATENT DOCUMENTS

| | | | |
|---|---|---|---|
| 6,304,989 B1 | 10/2001 | Kraus et al. | |
| 7,200,786 B2 * | 4/2007 | Cheng et al. | 714/733 |
| 7,228,468 B2 | 6/2007 | Wu et al. | |
| 7,237,154 B1 | 6/2007 | Zorian | |
| 7,260,758 B1 * | 8/2007 | Agrawal et al. | 714/733 |
| 7,779,312 B2 * | 8/2010 | Tseng et al. | 714/711 |
| 2007/0011535 A1 | 1/2007 | Anzou et al. | |
| 2008/0022176 A1 | 1/2008 | Anzou et al. | |
| 2009/0024885 A1 | 1/2009 | Anzou et al. | |
| 2009/0063917 A1 | 3/2009 | Tokunaga et al. | |

OTHER PUBLICATIONS

Kawagoe, T. et al, "A Built-in Self Repair Analyzer (Cresta) for Embedded Drams" International Test Conf. 2000.
Chen, J.T. et al, "Test Response Compression and Bitmap Encoding for Embedded Memories in Manufacturing Process Monitoring" International Test Conf. 2001.

* cited by examiner

*Primary Examiner* — James C Kerveros
(74) *Attorney, Agent, or Firm* — Turocy & Watson, LLP

(57) ABSTRACT

An on-chip failure analysis circuit for analyzing a memory has a memory in which data is stored, a built-in self test unit which tests the memory, a failure detection unit which detects a failure of the output of the memory, a fail data storage unit in which fail data is stored, the fail data including a location of the failure, a failure analysis unit which performs failure analysis using the number of failures detected by the failure detection unit and the location of the failure, the failure analysis unit writing fail data including the analysis result in the fail data storage unit, and an analysis result output unit which outputs the analysis result of the failure analysis unit.

17 Claims, 19 Drawing Sheets

| FAIL DATA |||||
|---|---|---|---|---|
| COLUMN FAILURE ||| REPAIRED FAILURE ||
| COLUMN ADDRESS | I/O INDEX | THE NUMBER OF FAILURES | ADDRESS | REDUNDANCY ALLOCATION RESULT |
| C1 | J0 | 1 | R4 | SPARE ROW 1 |
| C2 | J1 | 1 | C4 | SPARE COLUMN 1 |
| C6 | J6 | 1 | | |

| FAIL DATA ||||
|---|---|---|---|---|
| COLUMN FAILURE ||| DIAGNOSIS RESULT INFORMATION ||
| COLUMN ADDRESS | I/O INDEX | THE NUMBER OF FAILURES | ADDRESS | DETERMINED RESULT |
| C0 | J0 | 1 | R4 | SPARE ROW 1 |
| C1 | J1 | 2 | META FAILURE: NONE ||
| C2 | J2 | 1 |||
| C4 | J4 | 3 |||
| C6 | J6 | 2 |||

| FAIL DATA ||||| 
|---|---|---|---|---|
| COLUMN FAILURE ||| DIAGNOSIS RESULT INFORMATION ||
| COLUMN ADDRESS | I/O INDEX | THE NUMBER OF FAILURES | ADDRESS | DETERMINED RESULT |
| C0 | J0 | 1 | R4 | ROW FAILURE |
| C1 | J1 | 2 | C4 | COLUMN FAILURE |
| C2 | J2 | 1 | META FAILURE: NONE ||
| C6 | J6 | 2 |  ||

ON-CHIP FAILURE ANALYSIS CIRCUIT AND ON-CHIP FAILURE ANALYSIS METHOD

CROSS-REFERENCE TO RELATED APPLICATION

This application is based upon and claims the benefit of priority from the prior Japanese Patent Application No. 2007-339885, filed on Dec. 28, 2007; the entire contents of which are incorporated herein by reference.

BACKGROUND OF THE INVENTION

1. Field of the Invention

The present invention relates to an on-chip failure analysis circuit and an on-chip failure analysis method, particularly to an on-chip failure analysis circuit of a semiconductor integrated circuit in which a self test circuit for a memory is built and an on-chip failure analysis method.

2. Related Art

There is well known a method for detecting failures in a production test, in which a built-in self test (hereinafter referred to as "BIST (Built-In Self Test)") circuit is built in a semiconductor integrated circuit for embedded memories. Examples of the BIST circuit includes a comparator type BIST circuit which compares written data and read data to make a determination of the existence of a defect and a compressor type BIST circuit which compresses the read result in the BIST circuit to make the determination of the existence of the defect according to the compressed result.

There is also well known a repair technique of utilizing a memory cell having a redundant structure to repair the embedded memory determined as a defective memory. The memory cell having the redundant structure includes a spare row or a spare column. In the simplest case, the memory cell includes a set of spare rows or spare columns in each repair unit. In the more complicated case, the memory cell includes both the spare row and the spare column, the memory cell includes plural spare rows or spare columns, or one memory array is divided into plural segments each of which includes the memory cells having the repair structures.

In order to utilize the repair technique in the production of the semiconductor integrated circuit and the memory test, it is necessary to perform an analysis using the result of the memory test, to obtain a memory defect location and a spare used in repair (hereinafter referred to as "repair solution"), and to perform the redundancy allocation according to the obtained repair solution. Generally, the repair technique is realized as follows. That is, the memory test is performed using a memory tester and a direct access circuit which directly accesses the memory, a memory output map is written in a storage unit of the memory tester, and a program on the memory tester is started up to perform the analysis.

However, in the conventional repair technique, because the memory tester having a sufficiently large capacity of a storage unit is required to store pieces of fail data on all bits of the memory, it is necessary to use both the memory tester and a logic tester in the test for a system LSI (Large Scale Integration) including a logic circuit and the memory.

Because many embedded memories are provided on the usual large-scale system LSI, the direct access circuit is hardly prepared in each of all memories which become a repair object.

A built-in redundancy allocation (hereinafter referred to as "BIRA (Built-In Redundancy Allocation)" circuit which performs the analysis and redundancy allocation is well known as the technique of solving the problems (see Japanese Patent Application Laid-Open Publication No.2003-505814). The BIRA circuit is used along with the BIST circuit and obtains the repair solution by analyzing the fail data of the memory according to the failure detection result of the BIST circuit to output the obtained repair solution as the analysis result. In a production process of the semiconductor integrated circuit, a chip is repaired by programming a fuse device in which the analysis result is stored using a laser blow apparatus. In the case where the repair solution cannot be obtained, the BIRA circuit outputs the analysis result indicating that the repair solution cannot be obtained. In such cases, the analyzed chip is dealt with as a defective chip. The BIRA circuit can be realized by a relatively small-scale logic circuit for the minimum redundant structure having only one set of spare columns.

A document 1, "A Built-In Self-Repair Analyzer (CRESTA) for embedded DRAMs", International Test Conference, 2000, discloses a BIRA circuit. In the document 1, the BIRA circuit is used to repair the memory including plural spare rows and spare columns. In the document 1, the redundancy allocation is performed to all the possible repair solutions when the failure is detected in running the memory test, then a combination which successfully repairs the memory is adopted as an analysis result. Accordingly, in the document 1, a Content Addressable Memory (CAM), in which all the repair solutions are stored, is provided on the same integrated circuit.

However, in the BIRA circuit, because the number of repair solutions is increased as the numbers of spare columns and spare rows are increased, sometimes all the repair solutions cannot be stored in CAM. In the case where a new memory is provided for the purpose of the memory test, a hardware scale is enlarged, and disadvantageously the memory test needs to be run for the newly-provided memory.

On the other hand, a method for producing a complete fail bitmap of the memory is well known as the conventional memory analysis method.

However, in the conventional memory analysis method, it takes a long time to produce the complete fail bitmap in the case where information is collected in units of wafer or lot online during volume production. Particularly, the complete fail bitmap of the memory is not realistic when a logic tester and the BIST circuit are utilized.

On the other hand, in addition to the analysis for enhancing a production yield, there is well known a built-in self diagnosis (hereinafter referred to as "BISD (Built-In Self Diagnosis)" circuit which diagnoses the data used in the analysis. The BISD circuit makes a determination of a type of the memory failure such as a bit failure, row failure, column failure, or a combination thereof. A location of the defect is not always necessary for the BISD purpose.

A document 2, "Test Response Compression and Bitmap Encoding for Embedded Memories in Manufacturing Process Monitoring", International Test Conference, 2001, discloses a BISD circuit. In the document 2, fail data is compressed on the chip to produce a signature, the signature is output to the outside to be expanded and is reconstructed outside to make a determination of the type of the failure. In the document 2, because the data collection result is compressed, a data transfer time between the memory and the memory tester can be shortened to realize a type determination function for determining a type of the memory failure.

However, BISD circuit disclosed in the document 2, the type determination function depends on an external program, disadvantageously not only it takes a long time to analyze the memory like the conventional memory analysis, but also an information loss is generated due to the compression.

SUMMARY OF THE INVENTION

According to a first aspect of the present invention, there is provided an on-chip failure analysis circuit for analyzing a memory comprising:

a memory in which data is stored;
a built-in self test unit which tests the memory;
a failure detection unit which detects an failure of memory output of the memory;
a fail data storage unit in which fail data is stored, the fail data including a location of the failure;
an failure analysis unit which performs failure analysis using the number of failures detected by the failure detection unit and the location of the failure to write fail data including the analysis result in the fail data storage unit; and
an analysis result output unit which outputs the analysis result of the failure analysis unit.

According to a second aspect of the present invention, there is provided an on-chip failure analysis method for analyzing a memory comprising:

operating the memory to detect a failure of memory output of the memory;
performing failure analysis using the number of detected failures and a location of the failure to store fail data including the analysis result; and
outputting the analysis result.

DETAILED DESCRIPTION OF THE INVENTION

Exemplary embodiments of the present invention will be described with reference to the drawings. The following embodiments are described only by way of example, and the present invention is not limited to the embodiments.

First Embodiment

An on-chip failure analysis circuit according to a first embodiment of the present invention will be described below. The on-chip failure analysis circuit of the first embodiment of the present invention includes a BIRA circuit. The BIRA unit includes a repair analysis circuit which analyzes necessity of redundancy allocation and redundancy allocation result according to the numbers of spare columns and spare rows of the memory.

A configuration of an on-chip failure analysis circuit 100 of the first embodiment of the present invention will be described first.

Figure 1:
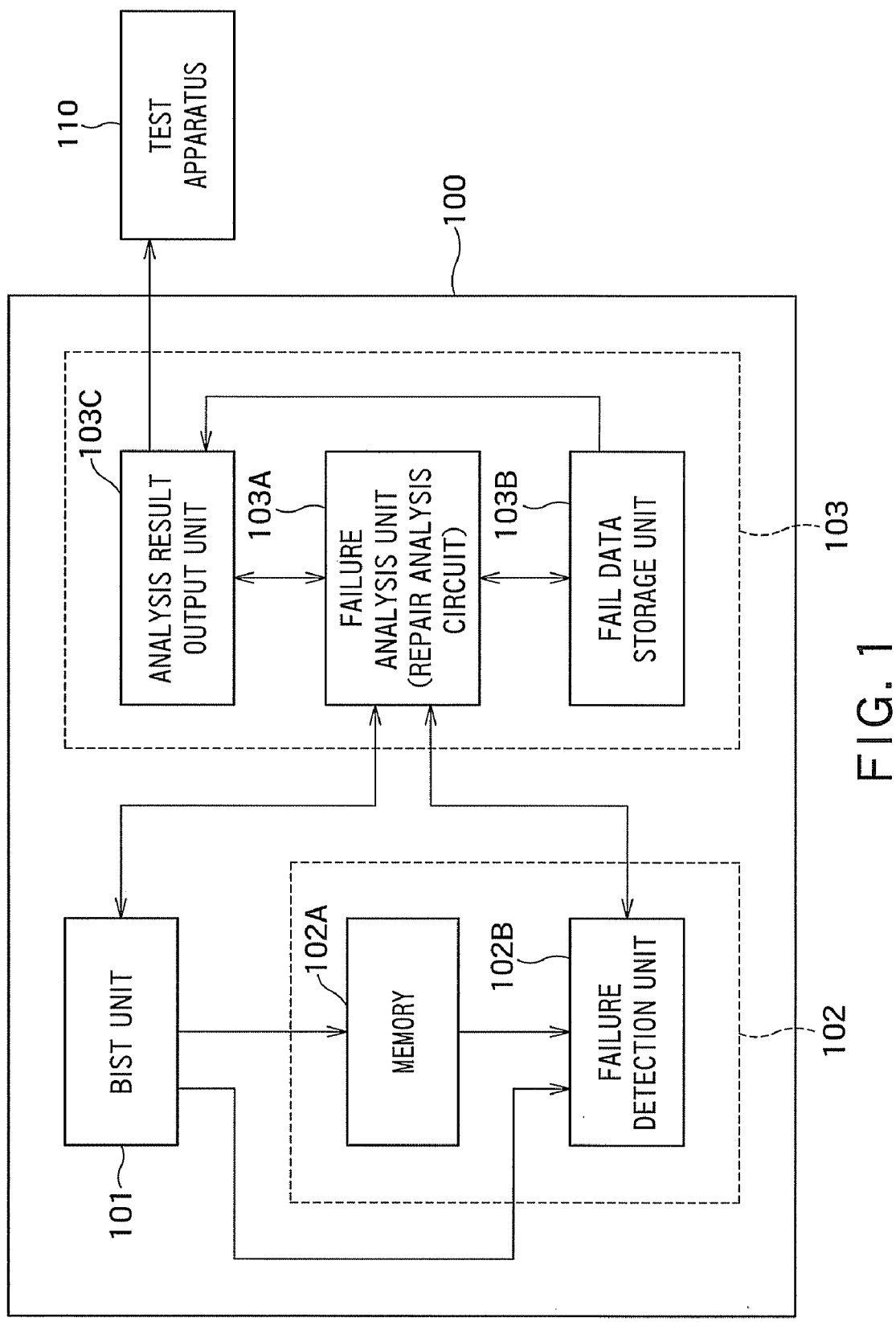
FIG. 1 is a block diagram showing the configuration of the on-chip failure analysis circuit 100 of the first embodiment of the present invention.

FIG. 1 is a block diagram showing the configuration of the on-chip failure analysis circuit 100 of the first embodiment of the present invention.

The on-chip failure analysis circuit 100 includes a BIST unit 101, a memory collar 102, and BIRA unit 103. The on-chip failure analysis circuit 100 is connected to a test apparatus 110.

The BIST unit 101 runs a self test of a memory 102A. The BIST unit 101 outputs data, an address (row address and column address), and a control signal to the memory 102A to control the memory 102A so as to perform a reading operation and a writing operation. The BIST unit 101 outputs an expected value of an output signal (hereinafter referred to as "memory output") in the reading operation of the memory 102A to a failure detection unit 102B. The BIST unit 101 outputs the address of the memory 102A in which a failure is detected to the failure analysis unit 103A.

The memory collar 102 includes the memory 102A and the failure detection unit 102B.

The memory 102A is a semiconductor memory device which has a two-dimensional redundant structure including a spare column and a spare row. The memory 102A performs the reading operation and writing operation according to the data, address, and control signal which are output from the BIST unit 101.

The failure detection unit 102B compares the memory output of the memory 102A to the expected value output from the BIST unit 101 to detect the failure of the memory output.

The BIRA unit 103 includes a failure analysis unit 103A, a fail data storage unit 103B, and an analysis result output unit 103C.

When the failure detection unit 102B detects the failure, the failure analysis unit 103A performs an analysis using the address output from the BIST unit 101 to write column fail data including a failure location (column address and I/O (Input/Output) index) and the number of failures in the fail data storage unit 103B. The failure analysis unit 103A analyzes the number of failures detected by the failure detection unit 102B with respect to the row address. The failure analysis unit 103A performs a row repair analysis process according to the analysis result and the number of effective spare columns of the memory 102A. The failure analysis unit 103A also performs a column repair analysis process according to the column fail data stored in the fail data storage unit 103B and the number of effective spare rows of the memory 102A. The failure analysis unit 103A includes a repair analysis circuit. The repair analysis circuit analyzes necessity of redundancy allocation and redundancy allocation result in the row repair analysis process and the column repair analysis process to write repair fail data including the analysis result in the fail data storage unit 103B.

The fail data storage unit 103B is a circuit that can store the fail data written by the failure analysis unit 103A and can have plural pieces of data of the same bit.

The analysis result output unit 103C reads the fail data (hereinafter referred to as "analysis result") including the repaired fail data stored in the fail data storage unit 103B to output the analysis result to the test apparatus 110.

The test apparatus 110 which is of an external device controls an input signal of the BIST unit 101 and observes an output signal of the BIST unit 101. The test apparatus 110 also reads the analysis result output from the analysis result output unit 103C.

Alternatively, in the first embodiment of the present invention, the on-chip failure analysis circuit 100 may include plural BIRA units 103.

The memory test of the first embodiment of the present invention will be described below.

Figure 6:
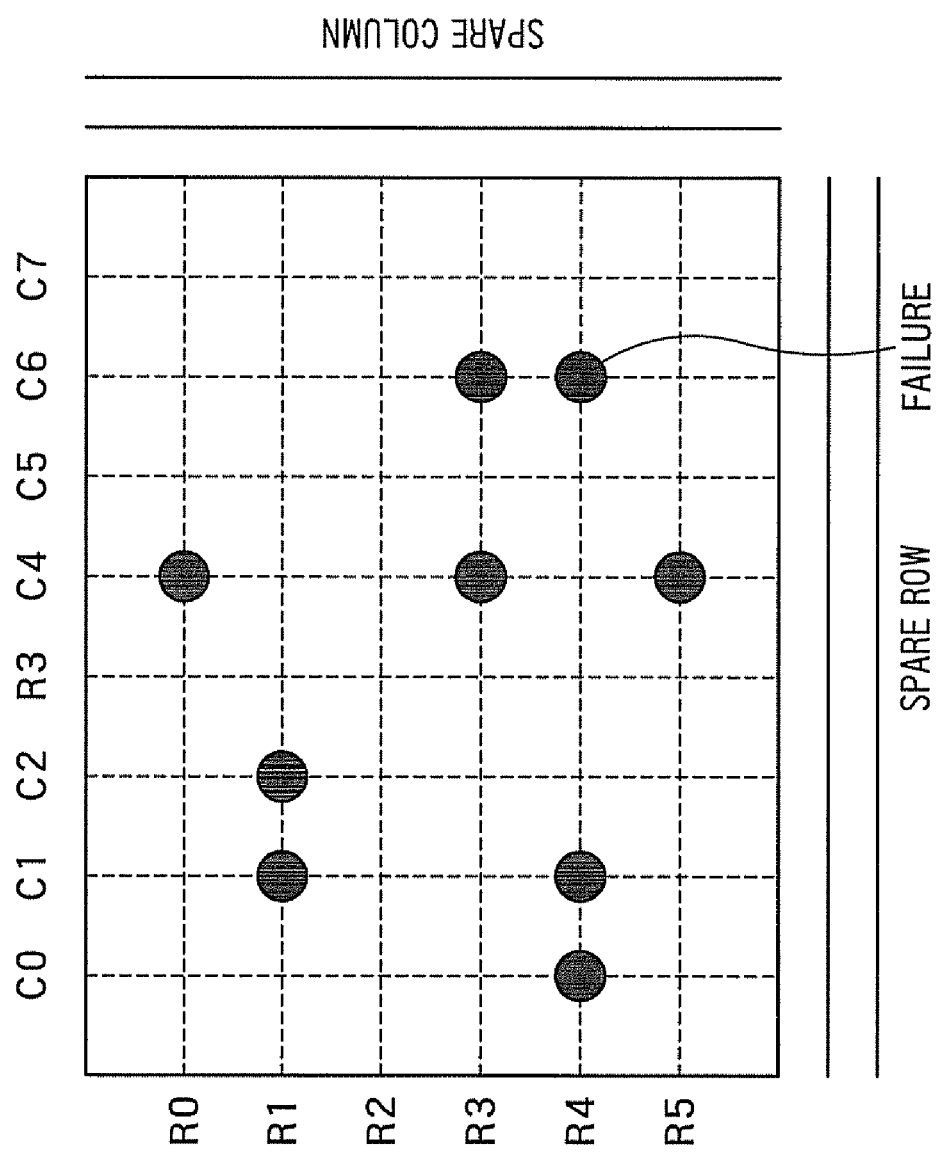
FIG. 6 is a diagram showing the status of memory 102A of the first embodiment of the present invention.

As shown in FIG. 6, the memory 102A is illustrated in the first embodiment of the present invention. The memory 102A includes a memory array, two spare columns, and two spare rows. The memory array has columns C0 to C7 and rows R0 to R5 where failures are included in some points. Each spare column and each spare row can independently be used for defect repair.

Figure 2:
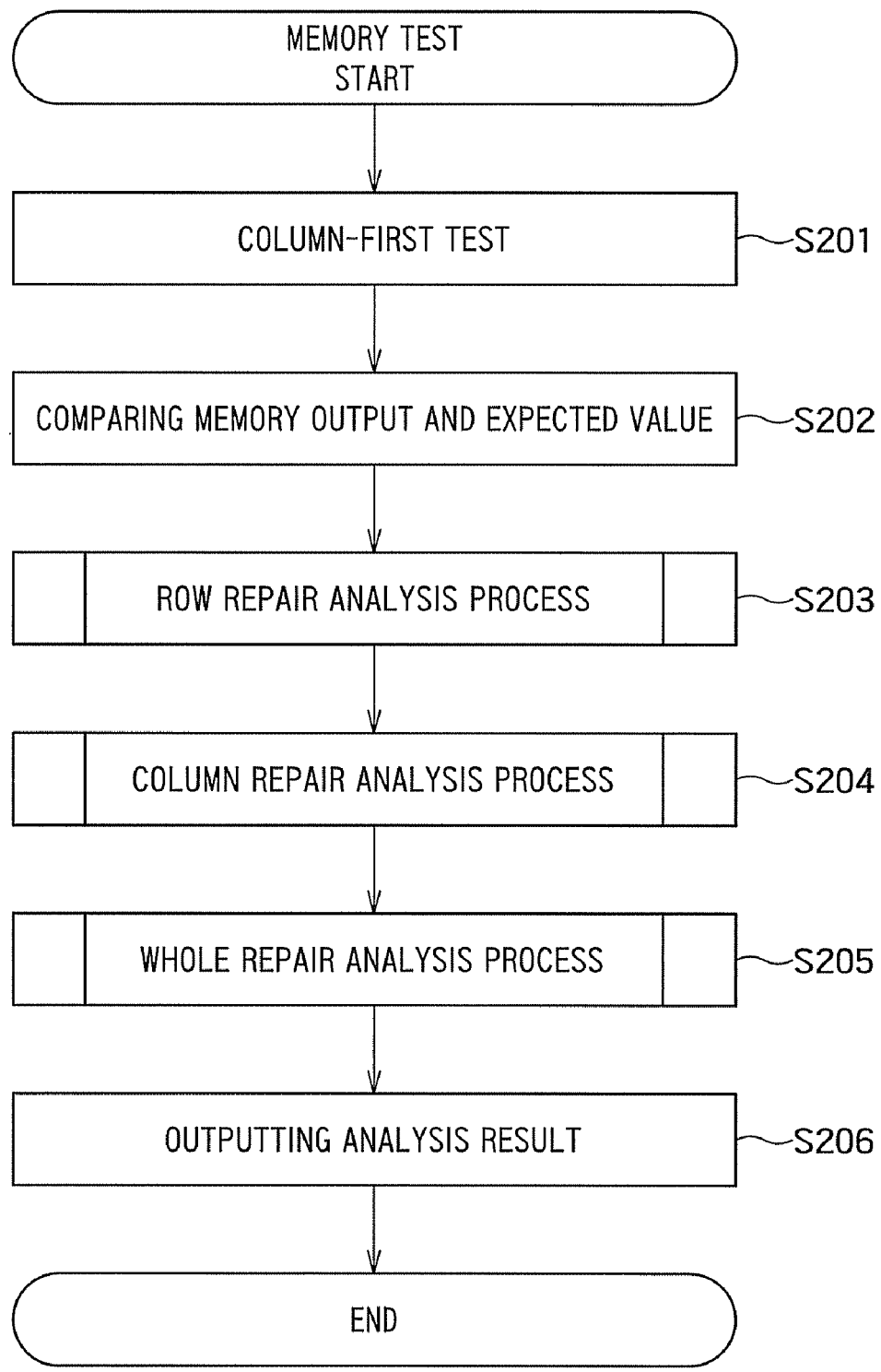
FIG. 2 is a flowchart showing a procedure for processing of the memory test of the first embodiment of the present invention.

FIG. 2 is a flowchart showing a procedure for processing of the memory test of the first embodiment of the present invention.

The BIST unit 101 runs a column-first test up to predetermined times (Step S201). The column-first test preferentially controls the column address of the memory 102A.

The failure detection unit 102B compares the memory output and the expected value output from the BIST unit 101 to detect the failure of the memory output (Step S202).

The failure analysis unit 103A performs a row repair analysis process (Step S203 and FIG. 3), a column repair analysis process (Step S204 and FIG. 4), in a whole repair analysis process (Step S205 and FIG. 5) as described later.

The analysis result output unit 103C reads the analysis result stored in the fail data storage unit 103B to output the analysis result to the test apparatus 110 (Step S206).

The memory test of the first embodiment of the present invention is completed after Step S206.

Alternatively, in the first embodiment of the present invention, the memory test process may be run once, or the memory test process may be run up to the predetermined times.

Additionally, in the first embodiment of the present invention, in Step S201, the column-first test and the row-first test may mutually be run.

Additionally, in the first embodiment of the present invention, in the case of the plural BIRA units 103, the memory test may simultaneously be processed or the memory test may sequentially be processed.

Figure 3:
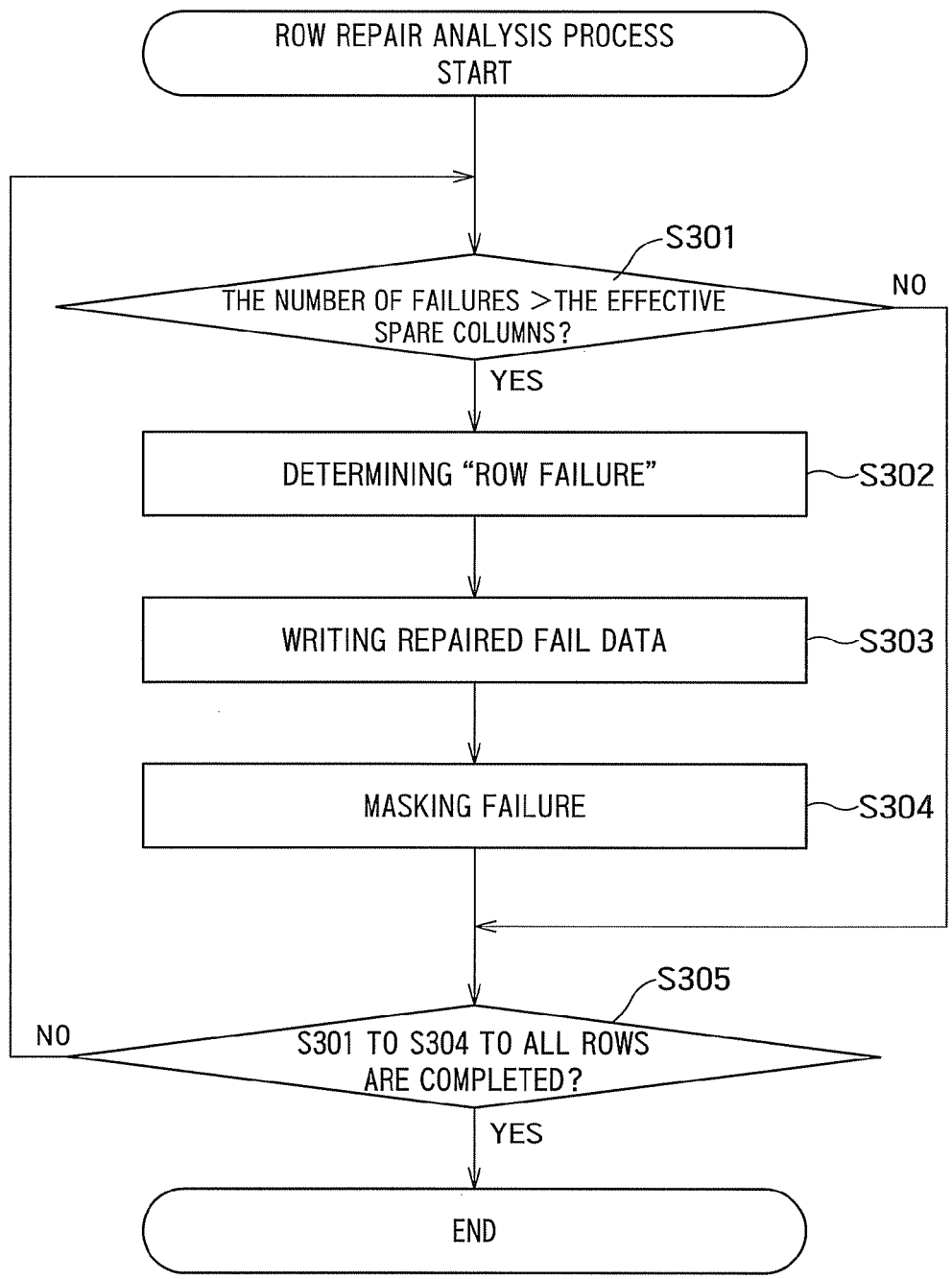
FIG. 3 is a flowchart showing a procedure for processing of the row repair analysis process of the first embodiment of the present invention.

FIG. 3 is a flowchart showing a procedure for processing of the row repair analysis process of the first embodiment of the present invention.

The failure analysis unit 103A refers to the number of failures detected in Step S202 of FIG. 2 and the row addresses in which the failures exist to determine whether or not the number of failures on one row is larger than the number of effective spare columns in the row address (Step S301). When the number of failures on one row is larger than the number of effective spare columns (YES in Step S301), the failure analysis unit 103A determines that the row address is a row failure (Step S302).

The failure analysis unit 103A writes the repaired fail data in the fail data storage unit 103B (Step S303). The repaired fail data includes the redundancy allocation result indicating that the spare row is allocated to the row address determined as the row failure in Step S302.

The failure analysis unit 103A masks the failure of the row address indicated by the repaired fail data written in Step S303 (Step S304).

On the other hand, when the number of failures on the row address is not more than the number of effective spare columns (NO in Step S301), the processes in Steps S302 to S304 are not performed to row address.

The failure analysis unit 103A determines whether or not the processes in Steps S301 to S304 to all the rows are completed (Step S305). When the processes in Steps S301 to S304 to all the rows are completed (YES in Step S305), the row repair analysis process of the first embodiment of the present invention is completed.

Figure 4:
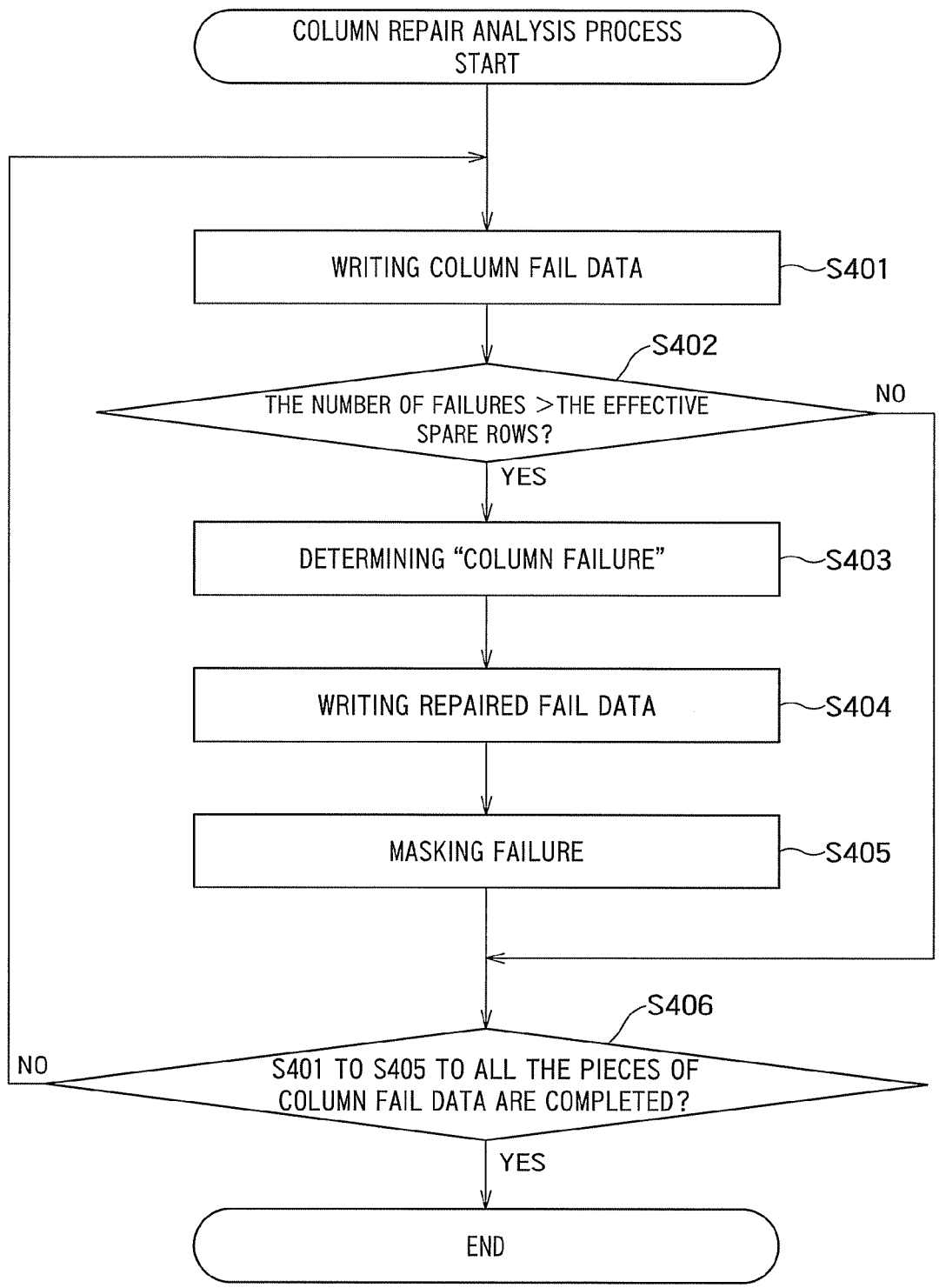
FIG. 4 is a flowchart showing a procedure for processing of the column repair analysis process of the first embodiment of the present invention.

FIG. 4 is a flowchart showing a procedure for processing of the column repair analysis process of the first embodiment of the present invention.

Figure 7:
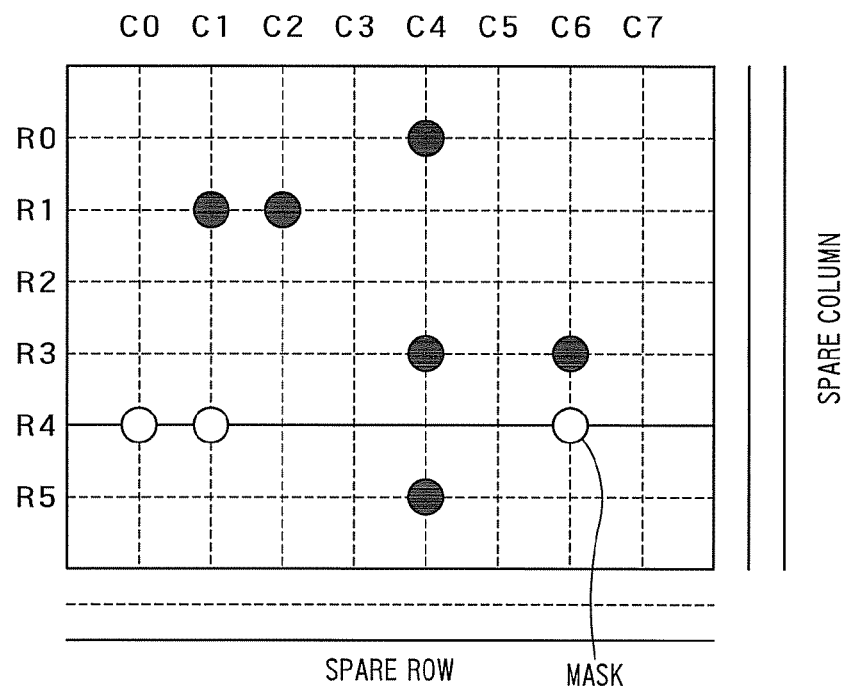
FIGS. 7 to 9 are diagrams showing the status of memory 102A and the fail data of the first embodiment of the present invention.

The failure analysis unit 103A writes the column fail data in the fail data storage unit 103B (Step S401). The column fail data includes the number of failures except for the failure masked in Step S305 of FIG. 3 and the column addresses and the I/O indexes in which the failures exist. FIG. 7 shows the result in Step S401.

The failure analysis unit 103A determines whether or not the number of failures on one column is larger than the number of effective spare rows in the column address (Step S402). When the number of failures on one column is larger than the number of effective spare rows (YES in Step S402), the failure analysis unit 103A determines that the column address and I/O index is a column failure (Step S403).

The failure analysis unit 103A writes the repaired fail data in the fail data storage unit 103B (Step S404). The repaired fail data includes the redundancy allocation result indicating that the spare column is allocated to the column address and the I/O index determined as the column failure in Step S403.

Figure 8:
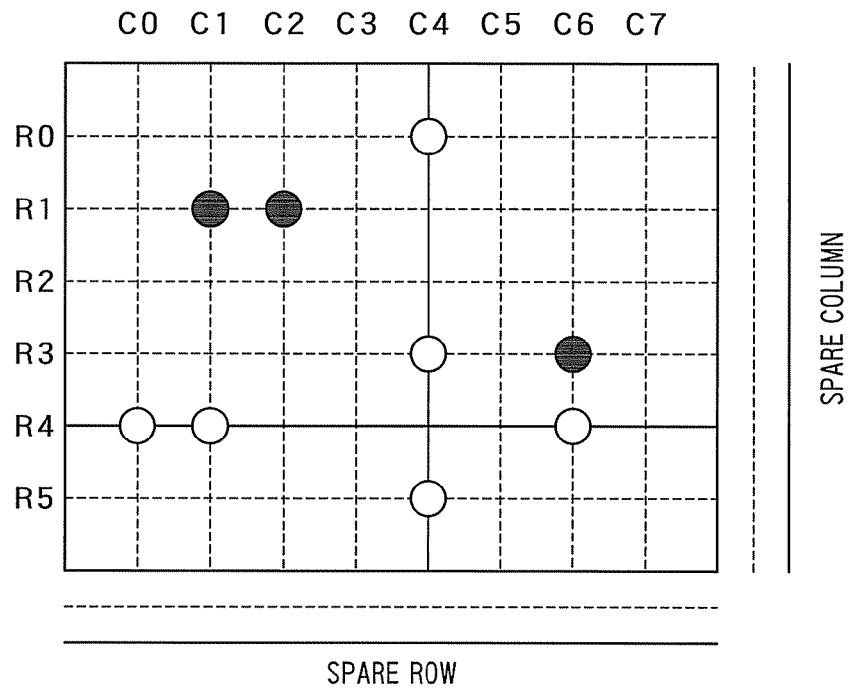

The failure analysis unit 103A masks the failure of the column address and the I/O index indicated by the repair fail data written in Step S404 (Step S405). FIG. 8 shows the result in Step S405.

On the other hand, when the number of failures on one column address and the I/O index is not more than the number of effective spare rows (NO in Step S402), the processes in Steps S403 to S405 are not performed to the column address and the I/O index.

The failure analysis unit 103A determines whether or not the processes in Step S401 to S405 to all the pieces of column fail data stored in the fail data storage unit 103B are completed (Step S406). When the processes in Steps S401 to S405 to all the pieces of column fail data are completed (YES in Step S406), the column repair analysis process of the first embodiment of the present invention is completed.

Figure 5:
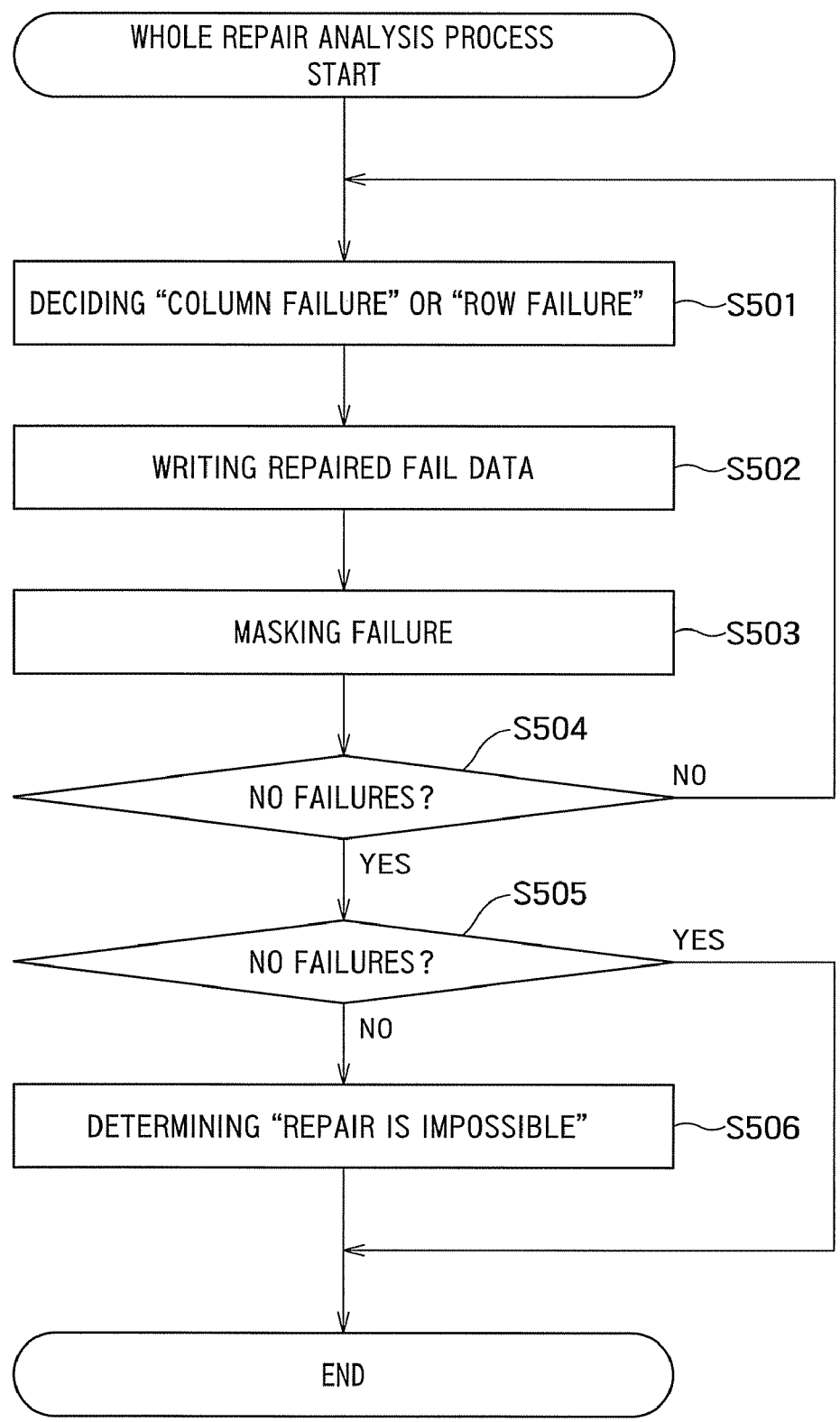
FIG. 5 is a flowchart showing a procedure for processing of the whole repair analysis process of the first embodiment of the present invention.

FIG. 5 is a flowchart showing a procedure for processing of the whole repair analysis process of the first embodiment of the present invention.

The failure analysis unit 103A refers to the column fail data stored in the fail data storage unit 103B to determine that the row address or column address and I/O index in which the failure exists is the row failure or column failure (Step S501).

The failure analysis unit 103A writes the repaired fail data in the fail data storage unit 103B (Step S502). The repaired fail data includes the redundancy allocation result indicating that the spare row or spare column is allocated to the row address or column address and I/O index which is determined as the row failure or column failure in Step S501.

The failure analysis unit 103A masks the failure of the row address or column address and I/O index which is indicated by the repair fail data written in Step S502 (Step S504).

The failure analysis unit 103A determines whether or not the processes in Steps S501 to S503 are performed until there are no spares (Step 504).

When the processes in Steps S501 to S503 are performed until there are no spares (YES in Step S504), the flow goes to Step S505.

The failure analysis unit 103A determines whether or not there are no failures (NO in Step S505). When there is no remaining spare but a failure exists, the failure analysis unit 103A determines that the repair is impossible (Step S506).

Figure 9:
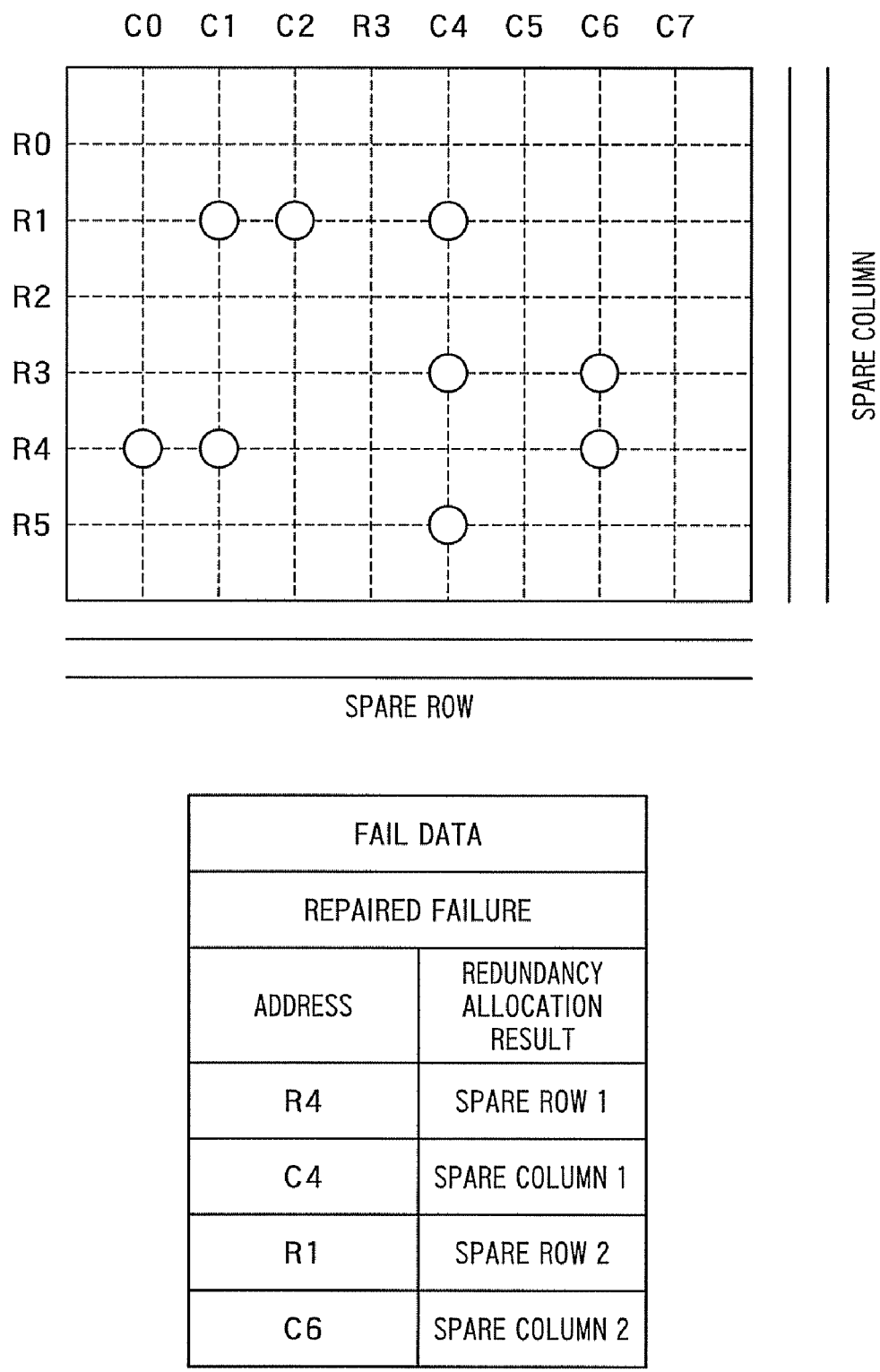

The whole repair analysis process of the first embodiment of the present invention is completed when there are no failures (YES in Step S505), or the whole repair analysis process is completed after the process in Step S506. FIG. 9 shows the result of the whole repair analysis process.

Alternatively, in the first embodiment of the present invention, the number of pieces of fail data written in the fail data storage unit 103B by the failure analysis unit 103A is variable, and the optimum number of pieces of fail data may be selected according to a scale of the memory 102A and a scale of the BIRA unit 103.

In accordance with the first embodiment of the present invention, the BIRA unit 103 including the failure analysis unit 103A and the fail data storage unit 103B performs the repair analysis process of the memory 102A without producing a complete fail bitmap, so that the time to process the memory test of the memory 102A can be shortened without enlarging the hardware scale. Particularly, in accordance with the first embodiment of the present invention, the BIRA unit 103 is connected to the BIST unit 101, and performs the failure analysis process according to the failure detected by the BIST unit 101, so that the increase in hardware scale can be restrained to the minimum.

Additionally, in accordance with the first embodiment of the present invention, the test cost can be optimized when the upper limit of the memory test is fixed.

Second Embodiment

A second embodiment of the present invention will be described below. The on-chip failure analysis circuit of the first embodiment of the present invention includes the BIRA unit having the repair analysis circuit which analyzes the necessity of redundancy allocation and the redundancy allocation result according to the numbers of spare columns and spare rows of the memory. On the other hand, an on-chip failure analysis circuit of the second embodiment of the present invention includes a BISD unit. The BISD unit includes a fault diagnosis circuit which diagnoses a type of the failure according to the number of failures and a lower limit of the number of failures. The description of the contents similar to those of the first embodiment of the present invention is neglected.

A configuration of an on-chip failure analysis circuit 200 of the second embodiment of the present invention will be described first.

Figure 10:
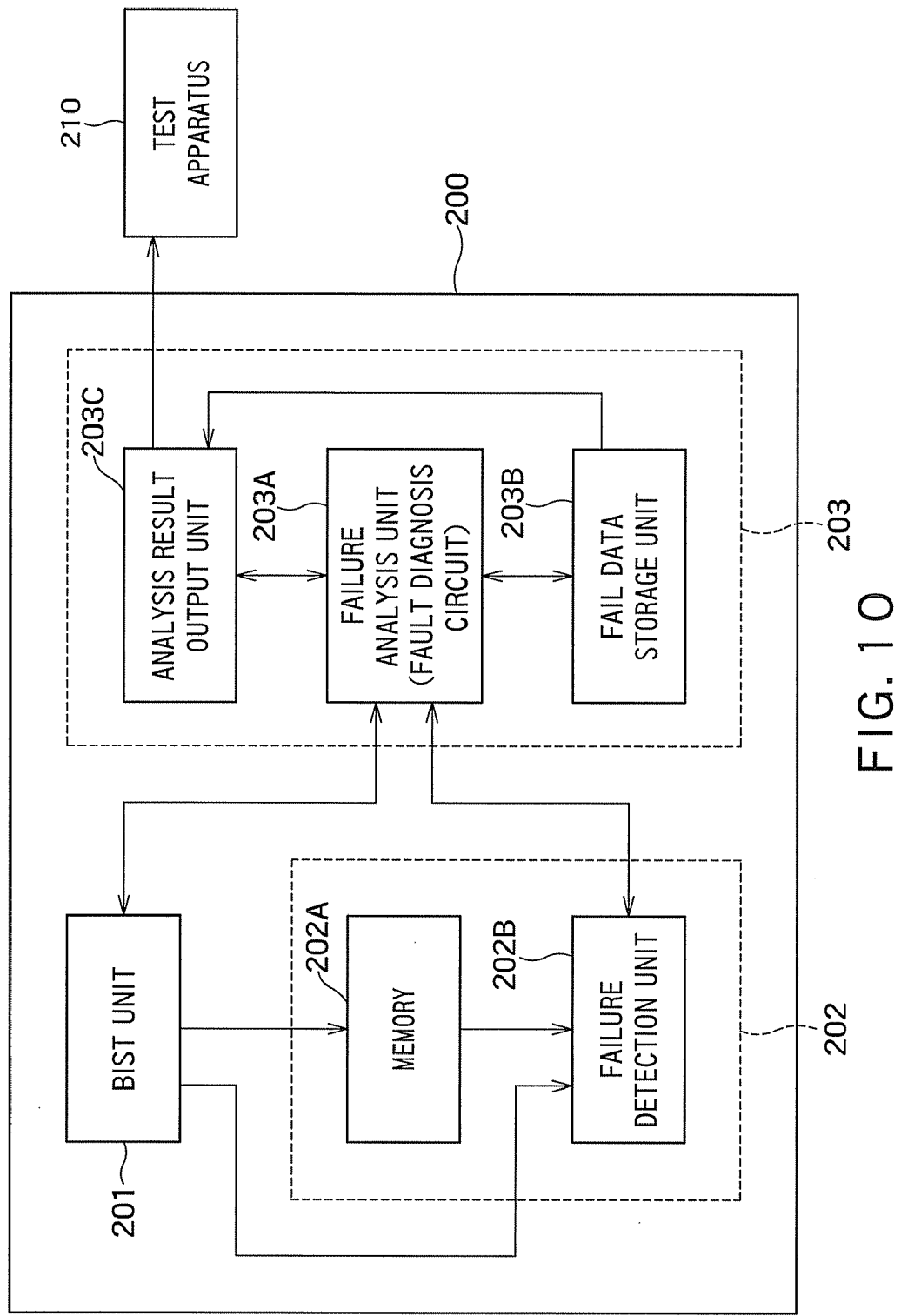
FIG. 10 is a block diagram showing the configuration of the on-chip failure analysis circuit 200 of the second embodiment of the present invention.

FIG. 10 is a block diagram showing the configuration of the on-chip failure analysis circuit 200 of the second embodiment of the present invention.

The on-chip failure analysis circuit 200 includes a BIST unit 201, a memory collar 202, and a BISD unit 203. The on-chip failure analysis circuit 200 is connected to a test apparatus 210.

The BIST unit 201 runs a self test of a memory 202A. The BIST unit 201 outputs the data, the address (row address and column address), and the control signal to the memory 202A to control the memory 202A so as to perform a reading operation and a writing operation. The BIST unit 201 outputs an expected value of the memory output in the reading operation of the memory 202A to a failure detection unit 202B. The BIST unit 201 outputs the address of the memory 202A in which the failure is detected to the failure analysis unit 203A.

The memory collar 202 includes the memory 202A and the failure detection unit 202B.

The memory 202A performs the reading operation and the writing operation according to the data, address, and control signal which are output from the BIST unit 201.

The failure detection unit 202B compares the memory output of the memory 202A to the expected value output from the BIST unit 201 to detect the failure of the memory output.

The BISD unit 203 includes a failure analysis unit 203A, a fail data storage unit 203B, and an analysis result output unit 203C.

When the failure detection unit 202B detects the failure, the failure analysis unit 203A performs an analysis using the address output from the BIST unit 201 to write column fail data in the fail data storage unit 203B. The column fail data includes a failure location (column address and I/O index) and the number of failures. The failure analysis unit 203A includes a fault diagnosis circuit. The fault diagnosis circuit analyzes the number of failures detected by the failure detection unit 202B with respect to the row address. The fault diagnosis circuit performs a row fault diagnosis process according to the analysis result and a lower limit of the number of row failures. In the row fault diagnosis process, the fault diagnosis circuit makes a determination of the type of the row failure. The fault diagnosis circuit analyzes the number of failures with respect to the column address and I/O index after the row fault diagnosis process. The fault diagnosis circuit performs a meta fault diagnosis process according to the analysis result and a lower limit of the number of meta failures. In the meta fault diagnosis process, the fault diagnosis circuit determines whether or not the failure is the meta failure. The fault diagnosis circuit analyzes the number of failures with respect to the column address and I/O index after the meta fault diagnosis process. The fault diagnosis circuit performs a column fault diagnosis process according to the analysis result and a lower limit of the number of column failures. In the column fault diagnosis process, the fault diagnosis circuit makes a determination of the column failure or a combination of the failure types. The fault diagnosis circuit writes analysis result in the fail data storage unit 203B. The analysis result includes pieces of diagnosis result information indicating the determination results. The analysis result includes not only the determination results of the row failure, meta failure, and column failure but also the combination of the failure types including the bit failure.

The fail data storage unit 203B is a circuit that can store the fail data written by the failure analysis unit 203A and can have plural pieces of data of the same bit.

The analysis result output unit 203C reads the analysis result stored in the fail data storage unit 203B, and outputs the analysis result to the test apparatus 210.

The test apparatus 210 which is of an external device controls an input signal of the BIST unit 201 and observes an output signal of the BIST unit 201. The test apparatus 210 also reads the analysis result output from the analysis result output unit 203C.

Alternatively, in the second embodiment of the present invention, the on-chip failure analysis circuit 200 may include plural BISD units 203.

The memory test of the second embodiment of the present invention will be described below.

Figure 15:
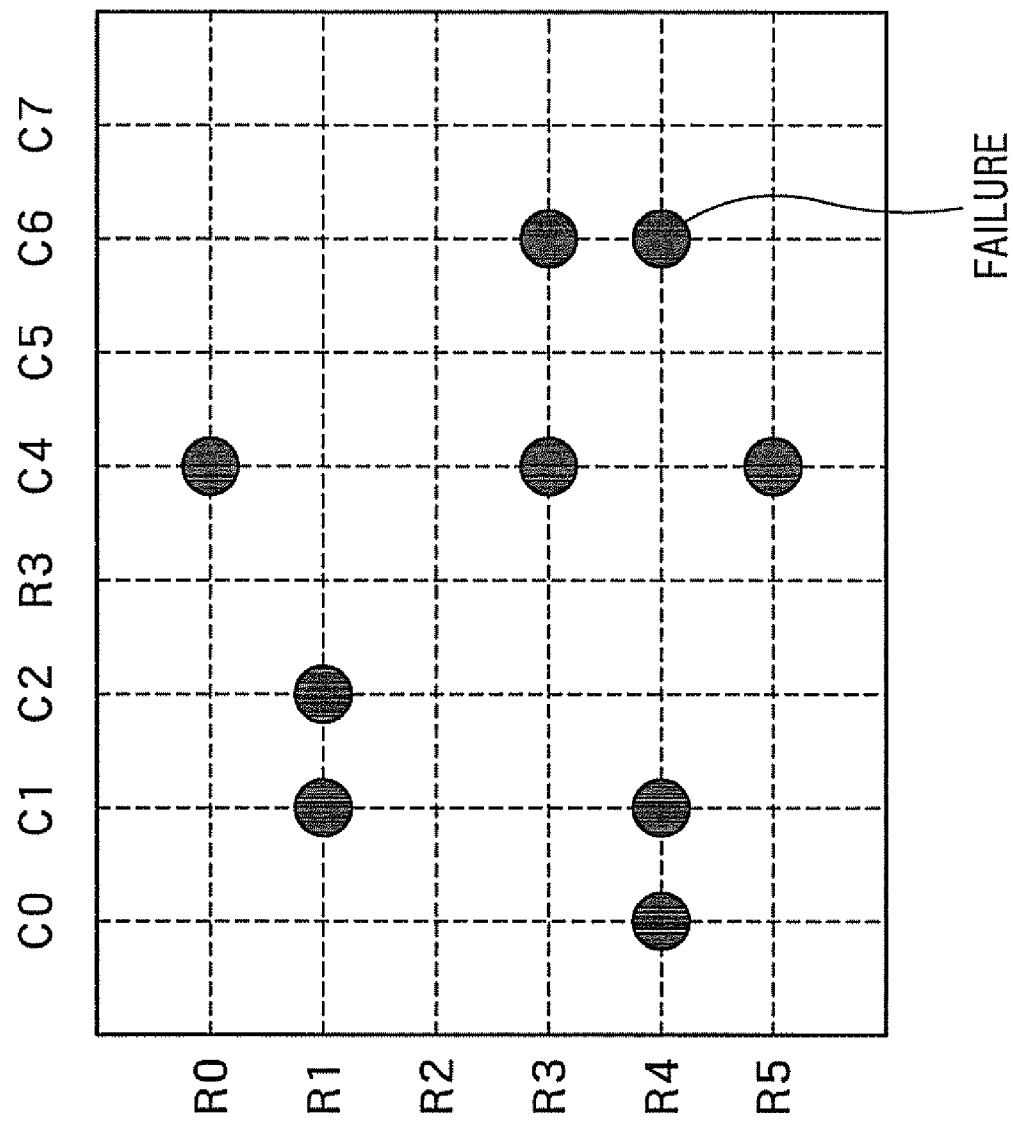
FIG. 15 is a diagram showing the status of memory 202A of the second embodiment of the present invention.

In the second embodiment of the present invention, as shown in FIG. 15, an upper limit Nrf of the number of row failures, an upper limit Ncf of the number of column failures, and an upper limit Nmf of the number of meta failures are predetermined circuit parameters, and it is assumed that Nrf=2, Ncf=2, and Nmf=2.

Figure 11:
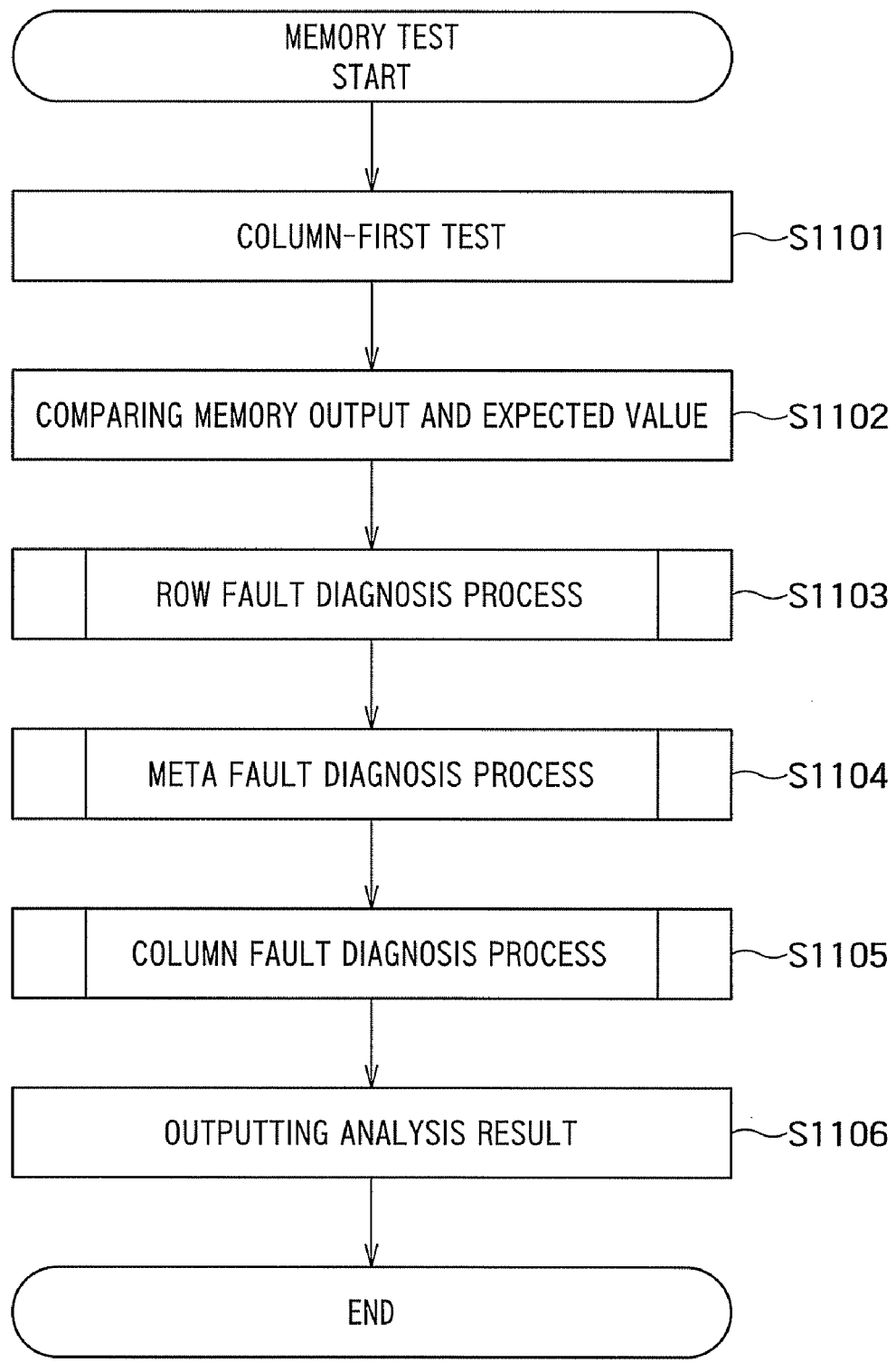
FIG. 11 is a flowchart showing a procedure for processing of the memory test of the second embodiment of the present invention.

FIG. 11 is a flowchart showing a procedure for processing of the memory test of the second embodiment of the present invention.

The BIST unit 201 runs a column-first test up to predetermined times (Step S1101). The first column test preferentially controls the column address of the memory 202A.

The failure detection unit 202B compares the memory output and the expected value output from the BIST unit 201 to detect the failure of the memory output (Step S1102).

The failure analysis unit 203A performs a row fault diagnosis process (Step S1103 of FIG. 12), a meta fault diagnosis process (Step 11204 of FIG. 13), and a column fault diagnosis process (Step S1105 of FIG. 14) as described later.

The analysis result output unit 203C reads the analysis result stored in the fail data storage unit 203B, and outputs the analysis result to the test apparatus 210 (Step S1106).

The memory test of the second embodiment of the present invention is completed after Step S1106.

Alternatively, in the second embodiment of the present invention, the memory test process may be run once, or the memory test process may be run up to the predetermined times.

Additionally, in the second embodiment of the present invention, in Step S1101, the first column test and the first row test may mutually be run.

Additionally, in the second embodiment of the present invention, in the case of the plural BISD units 203, the memory test may simultaneously be processed or the memory test may sequentially be processed.

Figure 12:
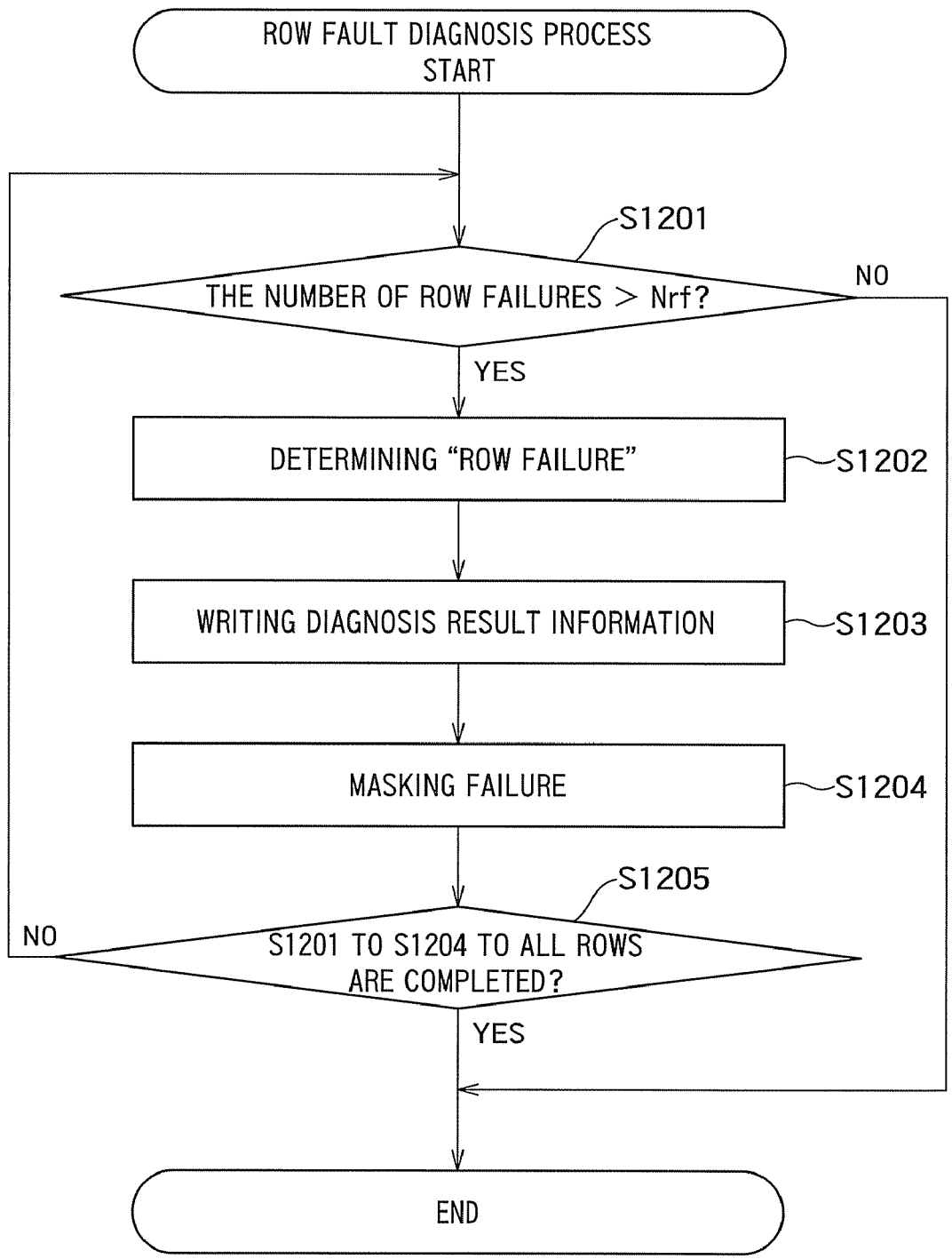
FIG. 12 is a flowchart showing a procedure for processing of the row fault diagnosis process of the second embodiment of the present invention.

FIG. 12 is a flowchart showing a procedure for processing of the row fault diagnosis analysis process of the second embodiment of the present invention.

The failure analysis unit 203A refers to the number of failures detected in Step S1102 of FIG. 11 and the row addresses in which the failures exist to determine whether or not the number of failures is larger than the upper limit Nrf of the number of row failures (Step S1201). When the number of failures is larger than the upper limit Nrf of the number of row failures (YES in Step S1201), the failure analysis unit 203A determines that the row address has a row failure (Step S1202).

The failure analysis unit 203A writes the diagnosis result information in the fail data storage unit 203B (Step S1203). The diagnosis result information includes the determination result indicating that the row address determined as the row failure in Step S1202 is the row failure.

Figure 16:
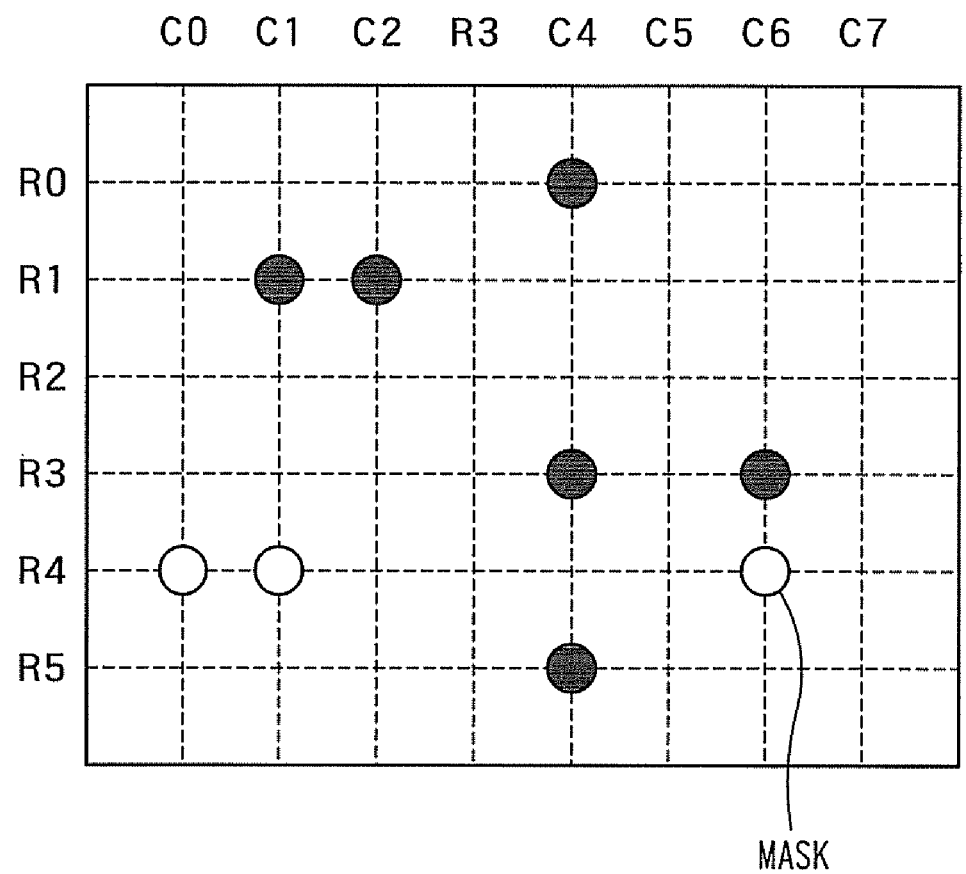
FIGS. 16 to 18 are diagrams showing the status of memory 202A and the fail data of the second embodiment of the present invention.

The failure analysis unit 203A masks the failure of the row address indicated by the diagnosis result information written in Step S1203 (Step S1204). FIG. 16 shows the state in Step S1204.

On the other hand, when the number of failures is not more than the upper limit Nrf of the number of row failures (NO in Step S1201), the processes in Steps S1202 to S1204 are not performed to row address.

The failure analysis unit 203A determines whether or not the processes in Steps S1201 to S1204 to all the rows are completed (NO in Step S1205). When the processes in Steps S1201 to S1204 to all the rows are completed (YES in Step S1205), the row fault diagnosis process of the second embodiment of the present invention is completed.

Figure 13:
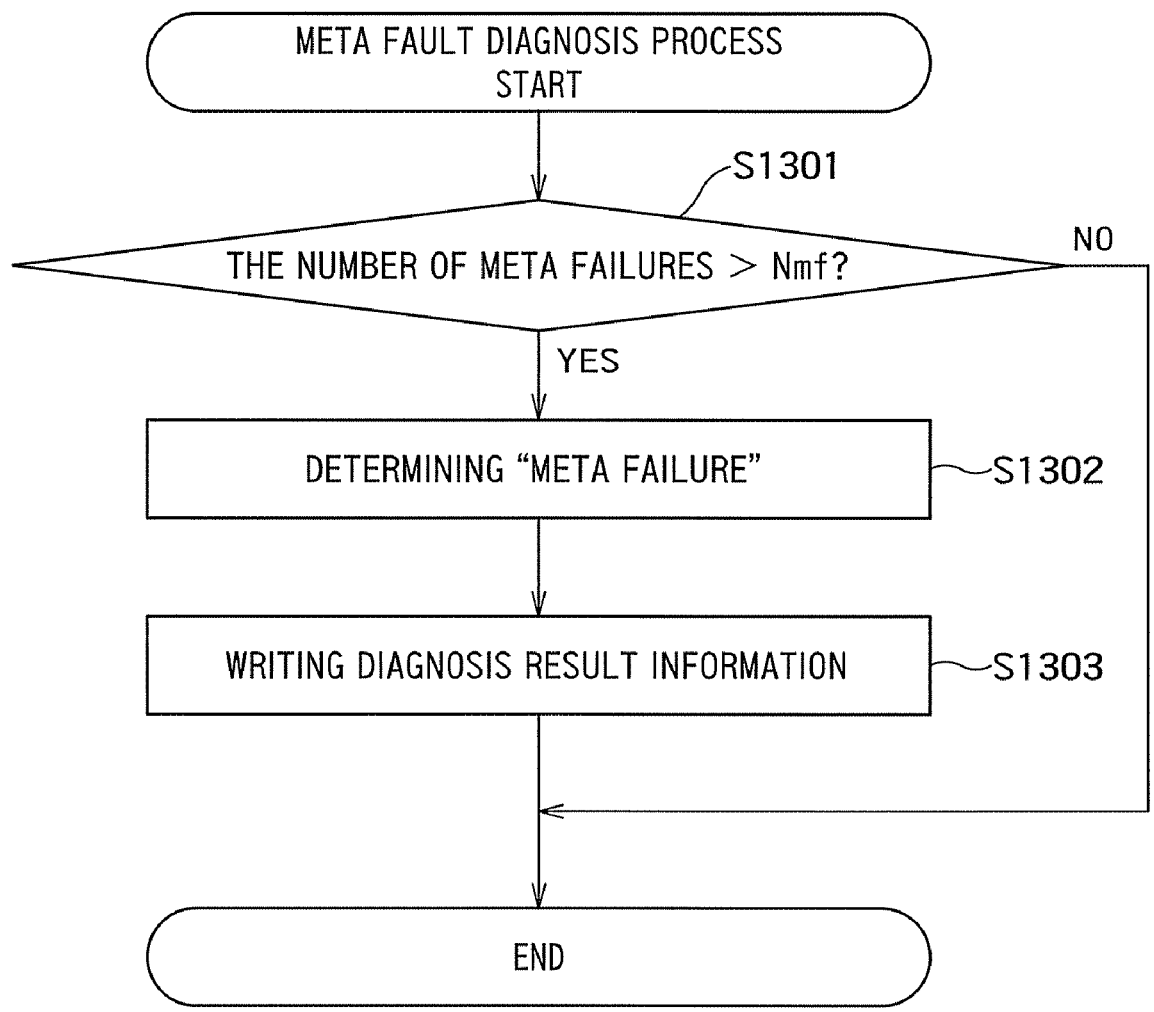
FIG. 13 is a flowchart showing a procedure for processing of the meta fault diagnosis process of the second embodiment of the present invention.

FIG. 13 is a flowchart showing a procedure for processing of the meta fault diagnosis process of the second embodiment of the present invention.

The failure analysis unit 203A determines whether or not the number of column failures is larger than an upper limit Nmf of the number of meta failures (Step S1301). When the number of column failures is larger than an upper limit Nmf of the number of meta failures (YES in Step S1301), the failure analysis unit 203A determines that the memory 202A has the meta failure (Step S1302).

The failure analysis unit 203A writes the diagnosis result information in the fail data storage unit 203B (S1303). The diagnosis result information includes the determination result indicating that the memory 202A has the meta failure.

On the other hand, when the number of column failures is not more than an upper limit Nmf of the number of meta failures (NO in Step S1301), the processes in Steps S1302 and S1303 is not performed.

Figure 14:
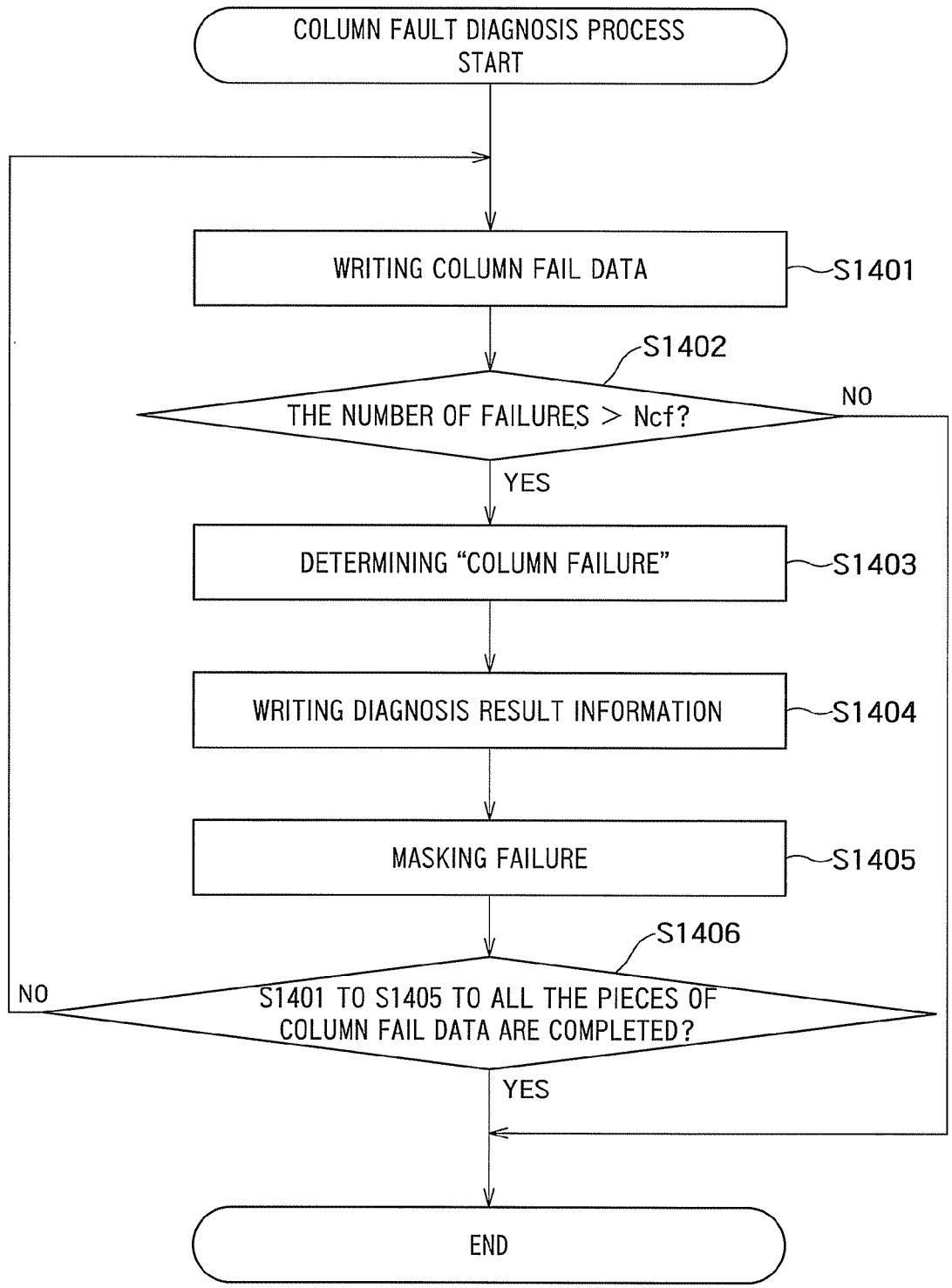
FIG. 14 is a flowchart showing a procedure for processing of the column fault diagnosis process of the second embodiment of the present invention.

FIG. 14 is a flowchart showing a procedure for processing of the column fault diagnosis process of the second embodiment of the present invention.

Figure 17:
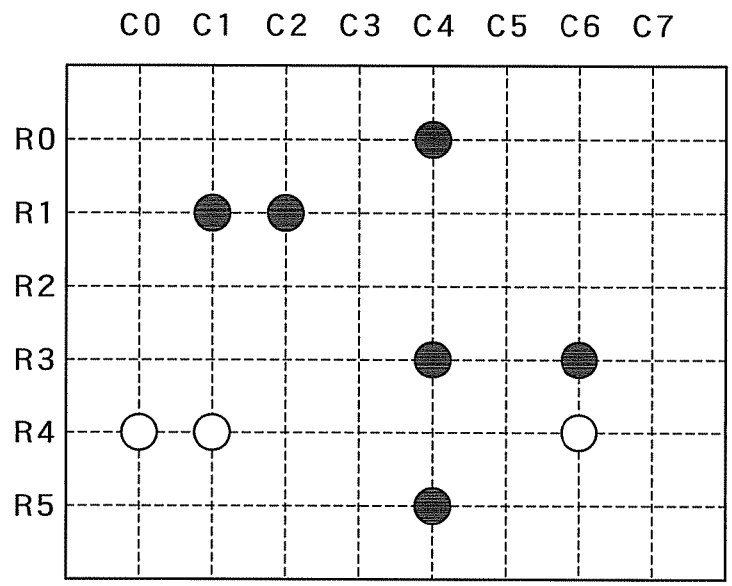

The failure analysis unit 203A writes the column fail data in the fail data storage unit 203B (Step S1401). The column fail data includes the number of failures except for the failure masked in Step S1204 of FIG. 12 and the column addresses and the I/O index in which the failures exist. FIG. 17 shows the result in Step S1401.

The failure analysis unit 203A refers to the column fail data written in Step S1401 to determine whether or not the number of failures on the column address and I/O index is larger than an upper limit Ncf of the number of column failures (Step S1402). When the number of failures on the column address and I/O index is larger than the upper limit Ncf of the number of column failures (YES in Step S1402), the failure analysis unit 203A determines that the column address and I/O index has a column failure (Step S1403).

The failure analysis unit 203A writes the diagnosis result information in the fail data storage unit 203B (Step S1404). The diagnosis result information includes the determination result indicating that the column address and the I/O index determined as the column failure in Step S1403 is the column failure.

Figure 18:
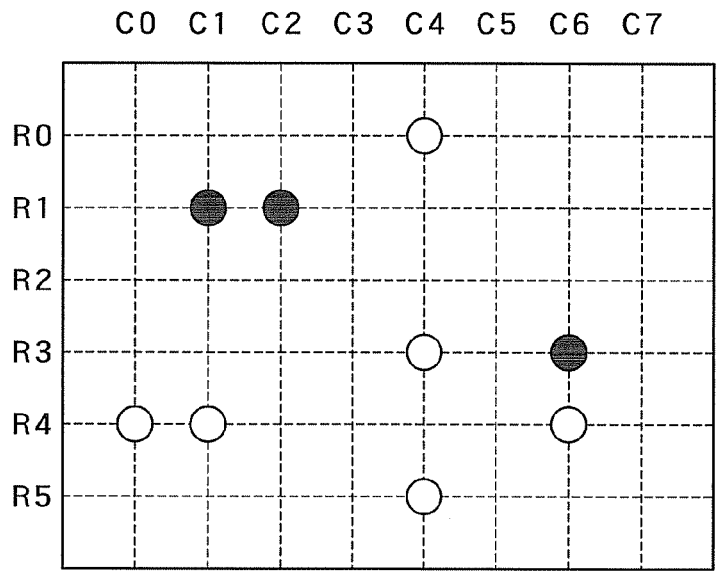

The failure analysis unit 203A masks the failure of the column address and the I/O index indicated by the diagnosis result information written in Step S1404 (Step S1405). FIG. 18 shows the result in Step S1405.

On the other hand, when the number of failures is not more than the upper limit Ncf of the number of column failures (NO in Step S1402), the processes in Steps S1403 to S1405 are not performed to the column address and the I/O index.

The failure analysis unit 203A determines whether or not the processes in Steps S1401 to S1405 to all the pieces of column fail data stored in the fail data storage unit 203B are completed (Step S1406). When the processes in Steps S1401 to S1405 to all the pieces of column fail data are completed (YES in Step S1406), the column fault diagnosis process of the second embodiment of the present invention is completed.

The failure which is not determined as any one of types of the failures (row failure, meta failure, and column failure) in the processes of FIGS. 12 to 14 is determined as the bit failure.

Alternatively, in the second embodiment of the present invention, the number of pieces of fail data written in the fail data storage unit 203B by the failure analysis unit 203A is variable, and the optimum number of pieces of fail data may be selected according to a scale of the memory 202A and a scale of the BISD unit 203.

In accordance with the second embodiment of the present invention, the BISD unit 203 including the failure analysis unit 203A and the fail data storage unit 203B performs the fault diagnosis process of the memory 202A independently of an external program and without compressing the fail data, so that the time to process the memory test of the memory 202A can be shortened without enlarging the hardware scale. Particularly, in accordance with the second embodiment of the present invention, the BISD unit 203 is connected to the BIST unit 201 and performs the fault diagnosis process according to the failure detected by the BIST unit 201, so that the increase in hardware scale can be restrained to the minimum.

Additionally, in accordance with the second embodiment of the present invention, the test cost can be optimized when the upper limit of the memory test is fixed.

Third Embodiment

A third embodiment of the present invention will be described below. In the on-chip failure analysis circuits of the first and second embodiments of the present invention, one of the repair analysis circuit and the fault diagnosis circuit is connected to the BIST unit. On the other hand, in an on-chip failure analysis circuit of the third embodiment of the present invention, both the repair analysis circuit and the fault diagnosis circuit are connected to the BIST unit. The description of the contents similar to those of the first and second embodiments of the present invention is neglected.

Figure 19:
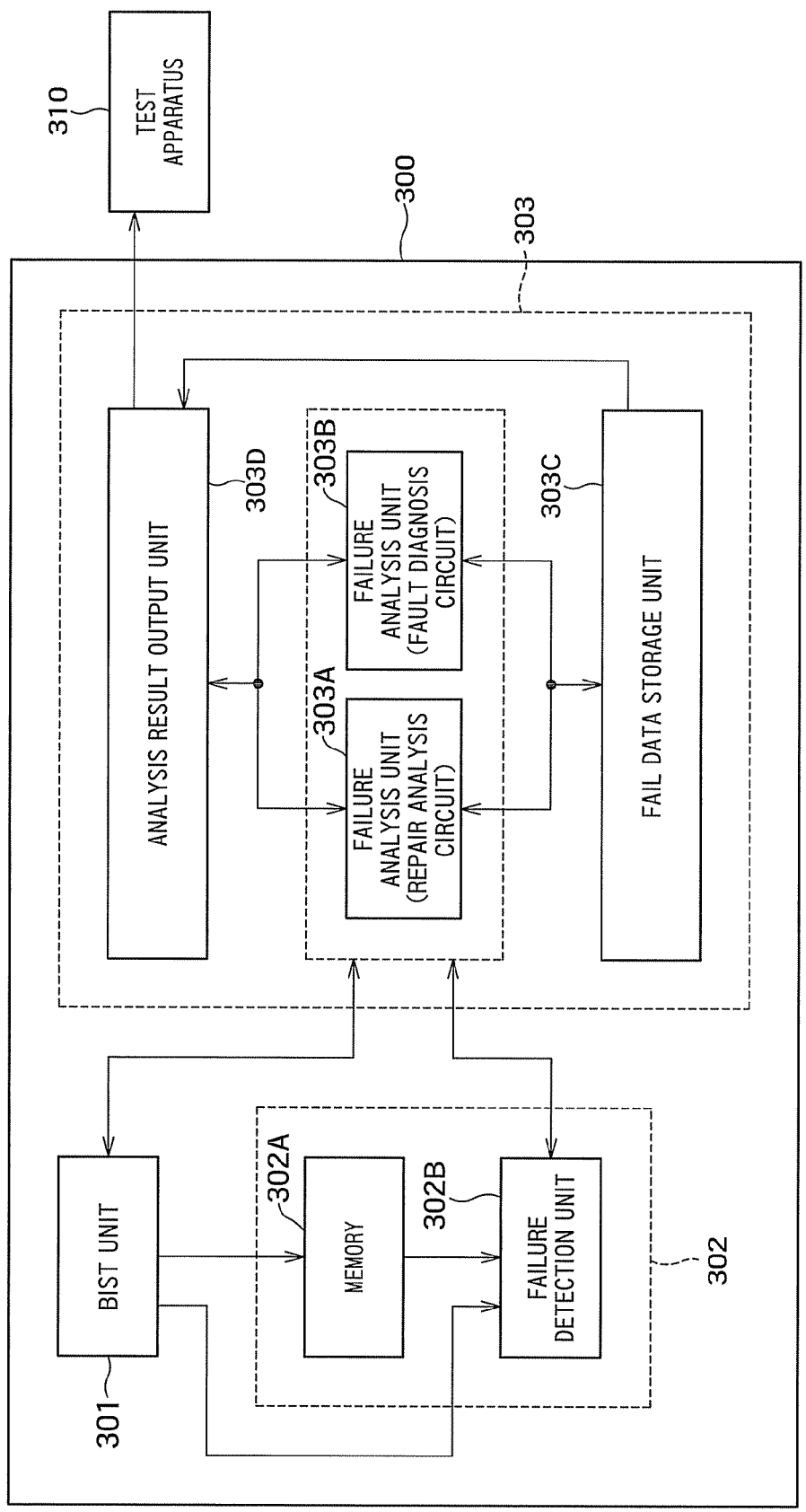
FIG. 19 is a block diagram showing the configuration of the on-chip failure analysis circuit 300 of the third embodiment of the present invention.

FIG. 19 is a block diagram showing a configuration of an on-chip failure analysis circuit 300 of the third embodiment of the present invention.

The on-chip failure analysis circuit 300 includes a BIST unit 301, a memory collar 302, and a BIRA and BISD unit 203. The on-chip failure analysis circuit 300 is connected to a test apparatus 310.

The BIST unit 301 runs a self test of a memory 302A. The BIST unit 301 outputs the data, the address (row address and column address), and the control signal to the memory 302A to control the memory 302A so as to perform a reading operation and a writing operation. The BIST unit 301 outputs an expected value of the memory output in the reading operation and writing operation of the memory 302A to a failure detection unit 302B. The BIST unit 301 outputs the address of the memory 302A in which the failure is detected to failure analysis units 303A and 303B.

The memory collar 302 includes the memory 302A and the failure detection unit 302B.

The memory 302A is a semiconductor memory device having a two-dimensional redundant structure including a spare column and a spare row. The memory 302A performs the reading operation and the writing operation according to the data, address, and control signal which are output from the BIST unit 301.

The failure detection unit 302B compares the memory output of the memory 302A to the expected value output from the BIST unit 301 to detect the failure of the memory output.

The BIRA and BISD unit 303 includes the failure analysis units 303A and 303B, a fail data storage unit 303C, and an analysis result output unit 303D.

When the failure detection unit 302B detects the failure, the failure analysis unit 303A performs an analysis using the address output from the BIST unit 301 to write column fail data in the fail data storage unit 303C. The column fail data includes a failure location (column address and I/O index) and the number of failures. The failure analysis unit 303A analyzes the number of failures detected by the failure detection unit 302B with respect to the row address. The failure analysis unit 303A performs the row repair analysis process according to the analysis result and the number of effective spare columns of the memory 302A. The failure analysis unit 303A performs the column repair analysis process according to the column fail data stored in the fail data storage unit 303C and the number of effective spare rows of the memory 302A. The failure analysis unit 303A includes a repair analysis circuit. The repair analysis circuit analyzes the necessity of redundancy allocation and the redundancy allocation result in the row repair analysis process and the column repair analysis process to write the repair fail data including the analysis result in the fail data storage unit 303C.

When the failure detection unit 302B detects the failure, the failure analysis unit 303B performs an analysis using the address output from the BIST unit 301 to write the column fail data in the fail data storage unit 303C. The column fail data includes the failure location (column address and I/O index) and the number of failures. The failure analysis unit 303B includes a fault diagnosis circuit. The fault diagnosis circuit analyzes the number of failures detected by the failure detection unit 302B with respect to the row address. The fault diagnosis circuit performs the row fault diagnosis process according to the analysis result and the lower limit of the number of row failures. In the row fault diagnosis process, the fault diagnosis circuit makes a determination of the type of the row failure. The fault diagnosis circuit analyzes the number of failures with respect to the column address and I/O index after the row fault diagnosis process. The fault diagnosis circuit performs the meta fault diagnosis process according to the analysis result and the lower limit of the number of meta failures. In the meta fault diagnosis process, the fault diagnosis circuit determines whether or not the failure is the meta failure. The fault diagnosis circuit analyzes the number of failures with respect to the column address and I/O index after the meta fault diagnosis process. The fault diagnosis circuit performs the column fault diagnosis process according to the analysis result and the lower limit of the number of column failures. In the column fault diagnosis process, the fault diagnosis circuit makes a determination of the column failure or a combination of the failure types. The fault diagnosis circuit writes analysis result in the fail data storage unit 303C. The analysis result includes pieces of diagnosis result information indicating the determination results. The analysis result includes not only the determination results of the row failure, meta failure, and column failure but also the combination of the failure types including the bit failure.

The BIST unit 301, the memory collar 302, the fail data storage unit 303C, and the analysis result output unit 303D and the information stored in the fail data storage unit 303C are shared by the failure analysis units 303A and 303B.

The fail data storage unit 303C is a circuit that can store the fail data written by the failure analysis units 303A and 303B, and can have plural pieces of data of the same bit.

The analysis result output unit 303D reads the fail data including the repair fail data or diagnosis result information stored in the fail data storage unit 303C. Then, the analysis result output unit 303D selectively outputs the repair fail data or the diagnosis result information to the test apparatus 310.

The test apparatus 310 which is of an external device performs a predetermined test according to the fail data output from the analysis result output unit 303D.

Alternatively, in the third embodiment of the present invention, the on-chip failure analysis circuit 300 may include plural BIRA and BISD units 303.

The memory test of the third embodiment of the present invention is similar to those of the first and second embodiments of the present invention, so that the description is neglected.

In according with the third embodiment of the present invention, the BIST unit 301, the memory collar 302, the fail data storage unit 303C, and the analysis result output unit 303D and the information stored in the fail data storage unit 303C are shared by the failure analysis units 303A and 303B. Therefore, the time to process the test of the memory 302A can be shortened without enlarging the hardware scale. The test includes the on-chip analysis of the repair analysis and fault diagnosis. Particularly, in the third embodiment of the present invention, the repair analysis process and the fault diagnosis process are performed by the one BIRA and BISD unit 303, so that the time to process the memory test can be largely shortened.

What is claimed is:

1. An on-chip failure analysis circuit for analyzing a memory, the circuit comprising:
 a built-in self test unit configured to test the memory;
 a failure detection unit configured to detect a failure of memory output of the memory;
 a fail data storage unit configured to store fail data comprising location of the failure;
 a repair analysis circuit configured to analyze necessity of redundancy allocation and redundancy allocation result, based on the numbers of spare columns and spare rows of the memory, to generate the fail data to be written in the fail data storage unit, the fail data comprising the redundancy allocation result;
 a fault diagnosis circuit configured to make a determination of a type of the failure emerging on the memory or a combination of the types of the failures according to the number of failures and an upper limit of the number of failures to write the fail data comprising the determination result in the fail data storage unit; and
 an analysis result output unit configured to output the redundancy allocation result.

2. circuit of claim 1, wherein the repair analysis circuit allocates the spare row when the number of failures on one row detected by the failure detection unit is larger than the number of effective spare columns.

3. The circuit of claim 2, wherein the fail data comprises redundancy allocation result indicating that the spare row is allocated to a row address and the repair analysis circuit masks the failure of the row address to which the spare row is allocated.

4. The circuit of claim 3, wherein the repair analysis circuit allocates the spare column when the number of failures on one un-masked column is larger than the number of effective spare rows.

5. The circuit of claim 4, wherein the fail data comprises redundancy allocation result indicating that the spare column is allocated to a column address and input-and-output index, and the repair analysis circuit masks the failure of the column address and the input-and-output index to which the spare column is allocated.

6. The circuit of claim 5, wherein the repair analysis circuit determines that the memory cannot be repaired when there is no allocatable spare row and an allocatable spare column in an address comprising the un-masked failure.

7. The circuit of claim 1, wherein the fault diagnosis circuit determines that a row address, in which the number of failures detected by the failure detection unit is larger than a predetermined upper limit of the number of row failures, is a row failure.

8. The circuit of claim 7, wherein the fault diagnosis circuit writes the fail data comprising the row address determined as the row failure, to mask the failure of the row address.

9. The circuit of claim 8, wherein the fault diagnosis circuit determines that the memory is a meta failure when the number of un-masked failures is larger than a predetermined upper limit of the number of meta failures.

10. circuit of claim 9, wherein the fault diagnosis circuit writes the fail data indicating that the memory is the meta failure in the fail data storage unit.

11. The circuit of claim 8, wherein the fault diagnosis circuit determines that a column address and input-and-output index, in which the number of un-masked failures is larger than a predetermined upper limit of the number of column failures, is a column failure.

12. The circuit of claim 11, wherein the fault diagnosis circuit writes the fail data comprising the column address and input-and-output index determined as the column failure in the fail data storage unit to mask the failure of the column address and input-and-output index.

13. The circuit of claim 1, wherein the fault diagnosis circuit determines that a failure whose failure type is not determined is a bit failure.

14. The circuit of claim 1, wherein the analysis result output unit selectively outputs at least one of the analysis result of the repair analysis circuit and the determination result of the fault diagnosis circuit.

15. The circuit of claim 14, wherein the repair analysis circuit determines that a row address, in which the number of failures detected by the failure detection unit is larger than the number of effective spare columns, is a row failure.

16. circuit of claim 14, wherein the fault diagnosis circuit determines that a row address, in which the number of failures detected by the failure detection unit is larger than a predetermined upper limit of the number of row failures, is a row failure.

17. The circuit of claim 14, wherein the fault diagnosis circuit determines that a failure whose failure type is not determined is a bit failure.

* * * * *

UNITED STATES PATENT AND TRADEMARK OFFICE
CERTIFICATE OF CORRECTION

PATENT NO.         : 8,037,376 B2
APPLICATION NO.    : 12/345298
DATED              : October 11, 2011
INVENTOR(S)        : Kenichi Anzou and Chikako Tokunaga Page 1 of 1

It is certified that error appears in the above-identified patent and that said Letters Patent is hereby corrected as shown below:

The error occurs on the last page in columns 13 and 14:
Column 13, line 51, Claim 2: "circuit of claim 1,..."
Column 14, line 27 Claim 10: "circuit of claim 9,..."
Column 14, line 51, Claim 16: "circuit of claim 14,..."

It should read:

Column 13, line 51, Claim 2: "The circuit of claim 1,..."
Column 14, line 27, Claim 10: "The circuit of claim 9,..."
Column 14, line 51, Claim 16: "The circuit of claim 14,..."

Signed and Sealed this
Tenth Day of July, 2012

David J. Kappos
*Director of the United States Patent and Trademark Office*